United States Patent [19]
Plummer

[11] Patent Number: 5,367,203
[45] Date of Patent: Nov. 22, 1994

[54] SYSTEM FOR DETERMINING THE TIME AT WHICH AN ANALOG VOLTAGE CROSSES A VOLTAGE THRESHOLD

[75] Inventor: Wylie J. Plummer, Poway, Calif.

[73] Assignee: Brooktree Corporation, San Diego, Calif.

[21] Appl. No.: 6,823

[22] Filed: Jan. 21, 1993

[51] Int. Cl.$^5$ .............................................. H03K 5/22
[52] U.S. Cl. ...................................... 327/78; 327/77; 327/63
[58] Field of Search ............... 307/351, 354, 355, 356, 307/362, 519, 517; 73/900, 901

[56] References Cited

U.S. PATENT DOCUMENTS 5,121,012  6/1992  Orlov .................................. 307/517

FOREIGN PATENT DOCUMENTS 0154218  7/1986  Japan ................................. 307/517

OTHER PUBLICATIONS

Technical Notes, Frequency Comparator Jan. 17, 1972 pp. 1-3.

*Primary Examiner*—William L. Sikes
*Assistant Examiner*—Jim Dudek
*Attorney, Agent, or Firm*—Ellsworth R. Roston; Charles H. Schwartz

[57] ABSTRACT

A system provides a uniform delay in crossovers in opposite directions of a variable input voltage relative to a reference voltage. A comparator is included for producing first and second comparison voltages in accordance with the relative magnitudes of the input and reference voltages. A clamping circuit provides first and second clamping voltages. A control circuit produces first and second control voltages dependent upon the individual occurrences of the first and second comparison voltages. The first control voltage is greater by a particular magnitude than the first clamping voltage. The second control voltage is less than the second clamping voltage by the particular magnitude. The control circuit includes an impedance connected between first and second lines for providing the first clamping voltage on the first line and the first control voltage on the second line during the production of the first comparison voltage and for providing the second clamping voltage on the second line and the second control voltage on the first line during the production of the second comparison voltage. A drive circuit produces on an output line first and second output voltages respectively related to the first and second clamping voltages. The drive circuit provides equally low delays, with a minimal loss of energy, between the production of the first output voltage and the first comparison voltage and between the production of the second output voltage and the second comparison voltage. The drive circuit includes a common output line for the first and second output voltages.

38 Claims, 3 Drawing Sheets

SYSTEM FOR DETERMINING THE TIME AT WHICH AN ANALOG VOLTAGE CROSSES A VOLTAGE THRESHOLD

This invention relates to a system for determining the time at which the magnitude of a variable analog input voltage crosses a voltage threshold at which circuits responsive to the analog input voltage are able to trigger subsequent stages. The invention particularly relates to a system in which the same delay is provided for the crossing of the threshold in a positive direction as in a negative direction and in which this delay is relatively low.

BACKGROUND OF INVENTION

Integrated circuit chips have become increasingly complex and precise through the years. Thousands, and even tens of thousands, of transistors are now disposed on a chip not more than a quarter of an inch ($\frac{1}{4}''$) in the longitudinal and lateral directions. Furthermore, these chips now operate with great precision in nanoseconds of time to perform tasks considered unattainable just a few years ago.

After they have been fabricated, the integrated circuits chips have to be tested. The testing of these chips has become increasingly complex as the integrated circuit chips have become increasingly complex. For example, the testing has to be provided at the same frequencies at which the integrated circuit chip will be operating. For example, the testing has to be often in the range of hundreds of megahertz and even gigahertz. Furthermore, the timing in the operation of the testing circuitry has to be performed with a precision in the order of nanoseconds in order to match the timing precision in the integrated circuit chips.

In testing integrated circuit chips, the times for the production of different signals in the chips have to be determined. Sometimes these signals change from a positive polarity to a negative polarity or from a high magnitude to a low magnitude. At other times the signals change from a negative polarity to a positive polarity or from a low magnitude to a high magnitude. When the signals change polarities or magnitudes, they reach a threshold level where they trigger the operation of stages responsive to these signals. Determinations have to be precisely made of the times when the signals reach this crossover level in either a positive-going direction or a negative-going direction.

Systems have been provided in the prior art for determining when variable analog input signals reach a threshold level in either a positive-going direction or a negative-going direction. The systems of the prior art have had certain inherent problems. One problem is that they respond to positive-going signals differently than negative-going signals. This causes the time measurements of crossover relative to the threshold voltage to be different for positive-going signals than for negative-going signals. Furthermore, the measurements have been relatively slow and have involved a considerable consumption of power. These problems have been recognized for some time. Attempts have been made to provide systems which resolve these problems but the attempts have not been successful.

BRIEF DESCRIPTION OF INVENTION

This invention provides a system which resolves the problems discussed in the previous paragraph. The system of this invention provides a uniform delay in magnitudinal crossovers in opposite directions of a variable input voltage relative to the reference voltage. A comparator is included for producing first and second comparison voltages in accordance with the relative magnitudes of the input and reference voltages.

A clamping circuit provides first and second clamping voltages. A control circuit produces first and second control voltages dependent upon the individual occurrences of the first and second comparison voltages. The first control voltage is greater by a particular magnitude than the first clamping voltage. The second control voltage is less than the second clamping voltage by the particular magnitude.

The control circuit includes an impedance connected between first and second lines for providing the first clamping voltage on the first line and the first control voltage on the second line during the production of the first comparison voltage and for providing the second clamping voltage on the second line and the second control voltage on the first line during the production of the second comparison voltage.

A drive circuit produces on an output line first and second output voltages respectively related to the first and second clamping voltages. The drive circuit provides equally low delays, with a minimal loss of energy, between the production of the first output voltage and the first comparison voltage and between the production of the second output voltage and the second comparison voltage. The drive circuit includes a common output line for the first and second output voltages.

DETAILED DESCRIPTION OF INVENTION

Figure 1:
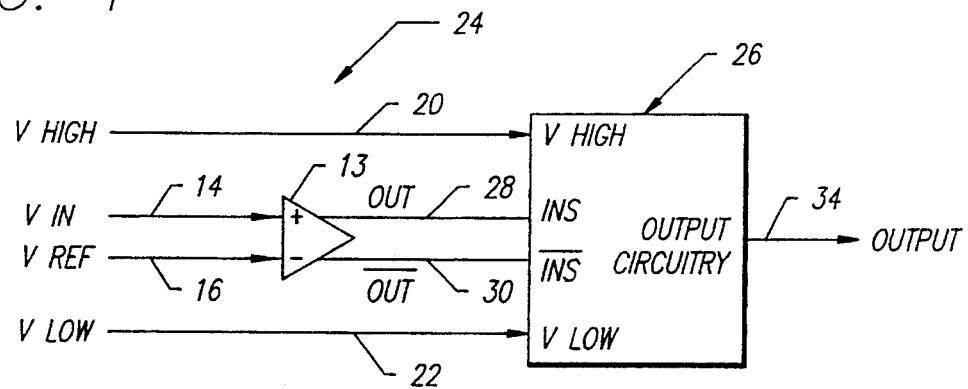
FIG. 1 is a simplified block diagram of a system constituting one embodiment of the invention for providing equal delays when the magnitude of a variable input voltage crosses a reference voltage in one direction and when magnitude of the variable input voltage crosses the reference voltage in an opposite direction.

A system constituting one embodiment of the invention is generally indicated at 24 in FIG. 1 and is shown in a schematic block diagram. The system 24 includes a comparator 13 which may be constructed in a conventional manner well known in the art. The comparator 13 receives voltages on input lines 14 and 16. The line 14 receives an input voltage (V IN) whose analog value is to be converted to a corresponding digital value. The line 16 receives a reference voltage (V REF) the magnitude of which is to be compared with the magnitude of the input voltage on the line 14.

The comparator 13 operates in a conventional manner to produce a voltage (OUT) on a line 28 when the voltage V IN on the line 14 exceeds the voltage V REF on the line 16. The comparator 13 produces a voltage ($\overline{\text{OUT}}$) on a line 30 when the voltage V REF on the line 16 exceeds the voltage V IN on the line 14. The voltages on the lines 28 and 30 are introduced to output circuitry generally indicated at 26 in FIG. 1. The output circuitry 26 is included in the system constituting this invention.

The output circuitry 26 in FIG. 1 also receives voltages on lines 20 and 22. When the circuitry driven by this invention is in transistor-transistor logic (TTL) circuitry (not shown), the voltage on the line 20 is at a suitable value such as approximately 2.8 volts. Similarly, the voltage on the line 22 is at a suitable voltage such as approximately 0.4 volts. These voltages symmetrically straddle a suitable threshold voltage such as approximately +1.6 volts in TTL circuitry.

The threshold voltage of approximately +1.6 volts triggers the TTL circuitry (not shown) from one state of operation to the other. The clamping voltages on the lines 20 and 22 are preferably regulated so that the system constituting this invention can accurately determine the time at which the input voltage on the line 14 crosses the threshold level of approximately +1.6 volts on the line 16 in either a positive or negative direction. The clamping voltages on the lines 20 and 22 are sufficiently different from the threshold level of approximately +1.6 volts so that the system constituting this invention will be immune to noise. Furthermore, by symmetrically straddling the reference voltage of approximately +1.6 volts, the clamping voltages of approximately +2.8 volts and +0.4 volts help to provide delay symmetry in the output on the line 34 in FIG. 1.

The output circuitry 26 operates upon the voltages on the lines 28 and 30 and the voltages on the lines 20 and 22 to provide an output on a line 34. The output on the line 34 is advantageous because it provides the same delay to the input voltage on the line 14 whether the input voltage is greater or less in magnitude than the reference voltage. The output circuitry provides this output on the line 34 with a minimum consumption of energy in the output circuitry and with a minimum delay.

Figure 2:
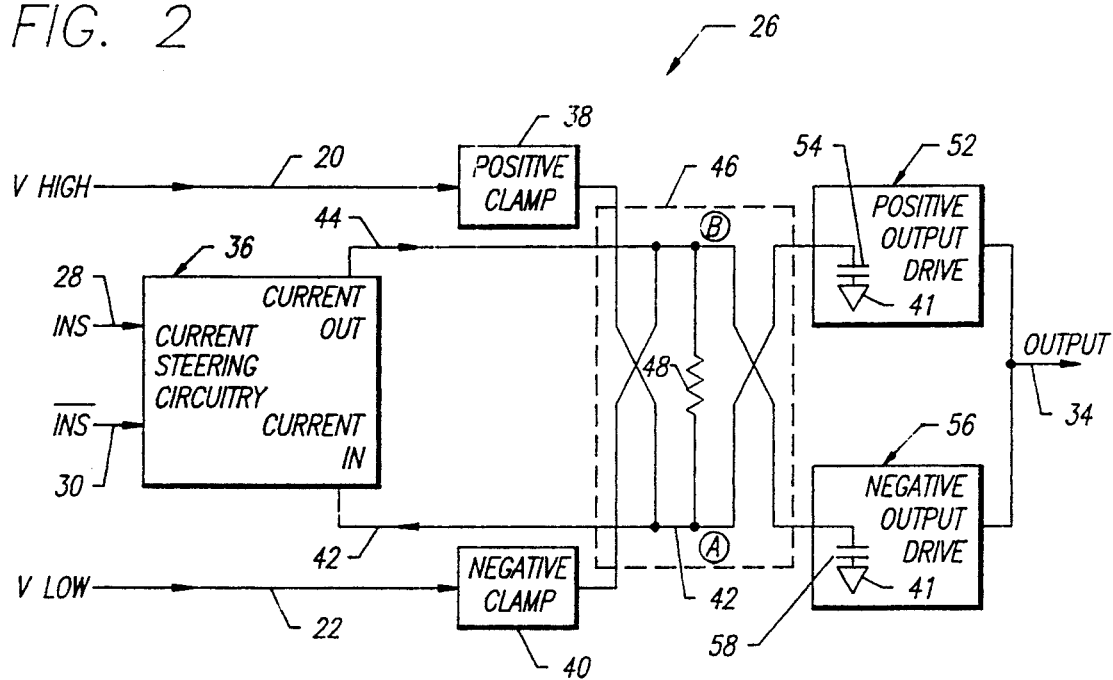
FIG. 2 is a circuit diagram, largely in block form, illustrating in further detail the portion of the FIG. 1 diagram illustrated in block form as output circuitry.

FIG. 2 shows the construction of the output circuitry 26 in additional detail. In the embodiment shown in FIG. 2, the voltages on the lines 28 and 30 are shown as being introduced to a current steering circuit generally indicated at 36 (shown in block form). The current steering circuit 36 is shown in detail in FIG. 3.

The current steering circuitry 36 provides currents on lines 42 and 44. An output current is provided on the line 44 when a voltage (indicated at INS in FIGS. 1 and 2) is provided on the line 28 which is more positive than the voltage on line 30 to indicate that the input voltage V IN is greater than the reference voltage V REF. A current is provided on the line 42 when a voltage (indicated at $\overline{\text{INS}}$ in FIGS. 1 and 2) is provided on the line 30 which is more positive than the voltage on the line 28 to indicate that the reference voltage V REF is greater than the voltage V IN.

The lines 42 and 44 are included in a coupling circuit 46 shown within broken lines in FIG. 2. The line 42 in the coupling circuit 46 is connected to a positive output drive circuit generally indicated in block form at 52 in FIG. 2. The circuit 52 is shown in detail in FIG. 4. The circuit 52 includes a small parametric capacitance 54 at its input end. The parametric capacitance 52 may be formed at least in part from distributed capacitances and may be considered as being grounded at one terminal as at 41. The line 42 is also connected to a positive clamp 38 which receives the clamping voltage on the line 20. The positive clamp 38 may be constructed in a conventional manner.

In like manner, a connection is made from the line 44 to a negative output drive circuit generally indicated in block form at 56 in FIG. 2. The circuit 56 is shown in detail in FIG. 4. The circuit 56 includes a small parametric capacitance 58 at its input end. The parametric capacitance 58 may be formed at least in part from distributed capacitances and may be considered as being grounded at one terminal as at 41. The line 44 is also connected to a negative clamp 40 which receives the clamping voltage on the line 22. The negative clamp 40 may be constructed in a conventional manner.

A resistance 48 having a suitable value such as approximately one hundred and twenty ohms (120 Ω) is connected between the lines 42 and 44. The resistance 48 is of a sufficiently low value to provide for a charging of the capacitances 54 and 58 in parallel. This shortens the delay time for the operation of the system constituting this invention. However, the resistance 48 is of a sufficiently high value so that the currents flowing through the drive circuits 52 and 56 are in milliamperes. This minimizes the energy consumed in the drive circuits 52 and 56.

When a positive output voltage is produced on the line 28 with respect to the voltage on the line 30, current flows from the current steering circuitry 36 through the line 44 in FIG. 2 to the coupling circuit 46. This current may be relatively low such as in the order of one milliampere (1 ma). This current produces a voltage drop across the resistance 48. When the voltage on the line 42 from the positive clamping circuit 38 is approximately 2.8 volts, a voltage of approximately 2.92 volts is produced on the line 44 as a result of the flow of current through the resistance 48. The voltage on the line 44 may be considered as a control voltage.

Similarly, when an output voltage is produced on the line 30 with respect to the voltage on the line 28, current flows into the current steering circuitry 36 through a circuit including the line 44, the resistance 48 in the coupling circuit 46 and the line 42. Since the line 44 receives the clamping voltage of approximately 0.4 volts from the negative clamping circuit 40 and since there is a voltage drop across the resistance 48, a voltage of approximately 0.28 volts is produced on the line 42. This voltage on the line 42 may be considered as a control voltage.

As previously described, the capacitances 54 and 58 are charged in parallel. As will be appreciated, the capacitances 54 and 58 are quite low. For these reasons, the capacitances 54 and 58 always become charged to the proper value in a minimal time. This assures that the system constituting this invention will always produce the proper output in a minimal time. Furthermore, the simultaneous charging or discharging of the capacitances 54 and 58 by approximately equal currents through the lines 42 and 44 helps to assure that there will be delay symmetry between the complementary inputs on the lines 28 and 30 and the outputs from the drivers 52 and 56. The output from the drivers 52 and 56 is produced on the common output line 34 also shown in FIG. 4.

Figure 6:
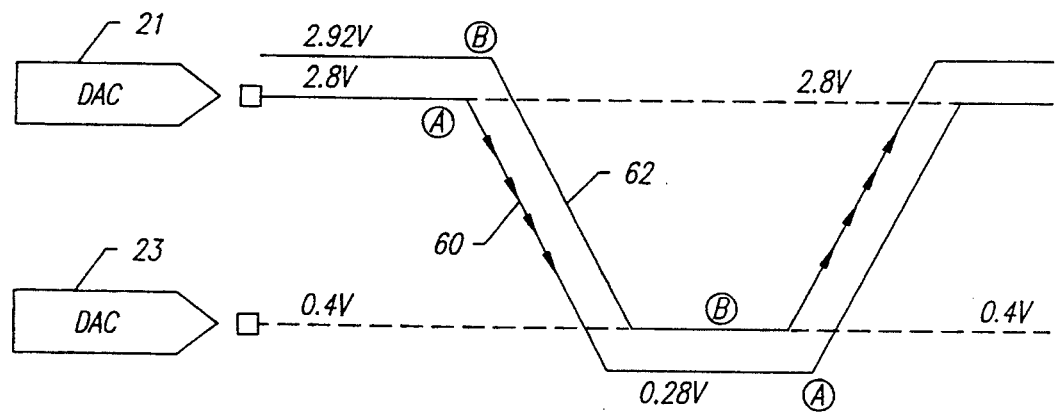
FIG. 6 is a schematic representation of the voltage waveforms respectively produced at the lines designated as A and B in the portion of the circuitry of FIG. 2 within the broken lines and at input terminals in FIG. 4.

FIG. 6 schematically illustrates the voltages respectively produced on the lines 42 and 44 as a result of the operation of the coupling circuit 46 when there are changes in the comparison voltages on the lines 28 and 30. The voltage produced on the line 42 is illustrated at 60 and the voltage produced on the line 44 is illustrated at 62. For purposes of facilitating understanding, the lines 42 and 44 are respectively designated in FIG. 2 as "A" and "B" and the voltage curves 60 and 62 in FIG. 6 are given similar designations.

As will be seen, the voltage 62 (2.92 V.) on the line B (44) is higher than the voltage 60 (2.8 V.) on the line A(42) in the steady state condition when the voltage on the line 28 is positive with respect to the voltage on the line 30. When the voltage on the line 30 becomes positive with respect to the voltage on the line 28, the control voltage 62 on the line B (44) starts to decrease toward the clamping voltage of approximately 0.4 volts.

As the voltage 62 on the line B (44) decreases toward approximately 0.4 volts, the control voltage 60 on the line A (42) correspondingly decreases because of the approximately constant voltage drop across the resistance 48. The voltage 62 on the line B (44) trails the control voltage 60 on the line A (42) in time because the voltage on the line A (42) is lower than the voltage on the line B (44). When the voltage 62 on the line B (44) reaches the clamping voltage of approximately 0.4 volts, the voltage 60 on the line A (42) has a value of approximately 0.28 volts because of the constant voltage difference of approximately 0.12 volts between the lines 44 and 42.

After the voltages 62 and 60 respectively on the lines B (44) and A (42) have respectively reached steady state values of approximately 0.4 and 0.28 volts, a positive signal may thereafter be produced on the line 28 with respect to the voltage on the line 30. The voltage 60 on the line A (42) accordingly rises toward the positive clamping voltage of approximately 2.8 volts and the voltage 62 on the line B (44) rises toward the control voltage of approximately 2.92 volts.

The voltage 60 on the line A (42) trails the voltage on the line B (44) in time by the substantially constant magnitude of 0.12 volts when the voltages are rising. This magnitude corresponds to the magnitude between the voltages on the lines 42 and 44 when a positive voltage is produced on the line 30 with respect to voltage on the line 28 as discussed in the previous paragraphs. The difference between the voltage 62 on the line B (44) and the voltage 60 on the line A (42) results from the flow of current through the resistance 48.

As will be seen in FIG. 1, the voltage 60 on the line A (42) is introduced to the positive output drive circuit 52 to obtain an output of relatively high value on the output line 34. In like manner, the voltage 62 on the line B (44) is introduced to the negative output drive circuit 56 and produces a low voltage on the output line 34 when the clamping voltage is 0.4 volts. The clamping circuits 38 and 40 respectively provide clamping voltages of 2.8 volts and 0.4 volts. These voltages respectively straddle the threshold voltage of approximately 1.6 volts. This is the voltage for triggering successive stages when such successive stages are in transistor-transistor logic (TTL) circuitry.

Figure 5:
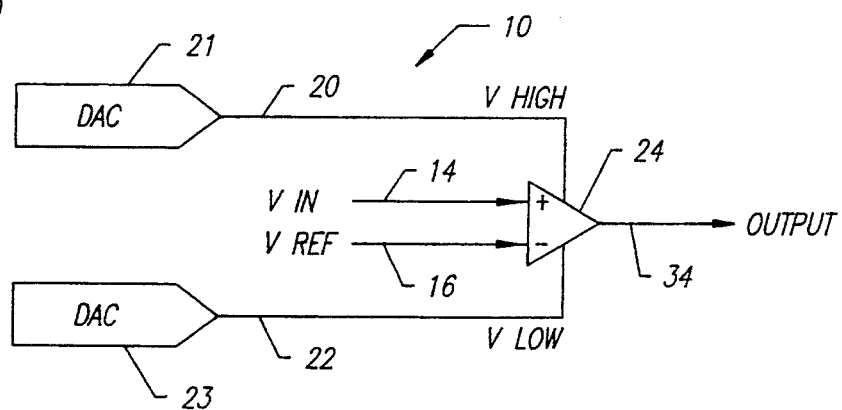
FIG. 5 is a block diagram of a system for producing the clamping voltages provided by the "Positive Clamp" and "Negative Clamp" in the circuitry shown in FIG. 2.

If the clamping circuits 38 and 40 do not provide clamping voltages equally above and below the threshold voltage, the system 24 shown in FIG. 1 may be adjusted to provide the desired clamping voltages. This adjustment may be made by circuitry shown in FIG. 5 to provide the clamping voltage of +2.8 volts on the line 20 and the clamping voltage of +0.4 volts on the line 22. These adjustments may be provided in FIG. 5 by digital-to-analog converters 21 and 23. By adjusting the voltages from the converters 21 and 23 to the desired values, delay symmetry is achieved between the time for the production of the output voltage on the line 34 for a greater voltage on the line 28 than on the line 30 and on the line 34 for a greater voltage on the line 30 than on the line 28. The adjustment of voltages by digital-to-analog converters such as the converters 21 and 23 in FIG. 5 is well known in the art.

Figure 4:
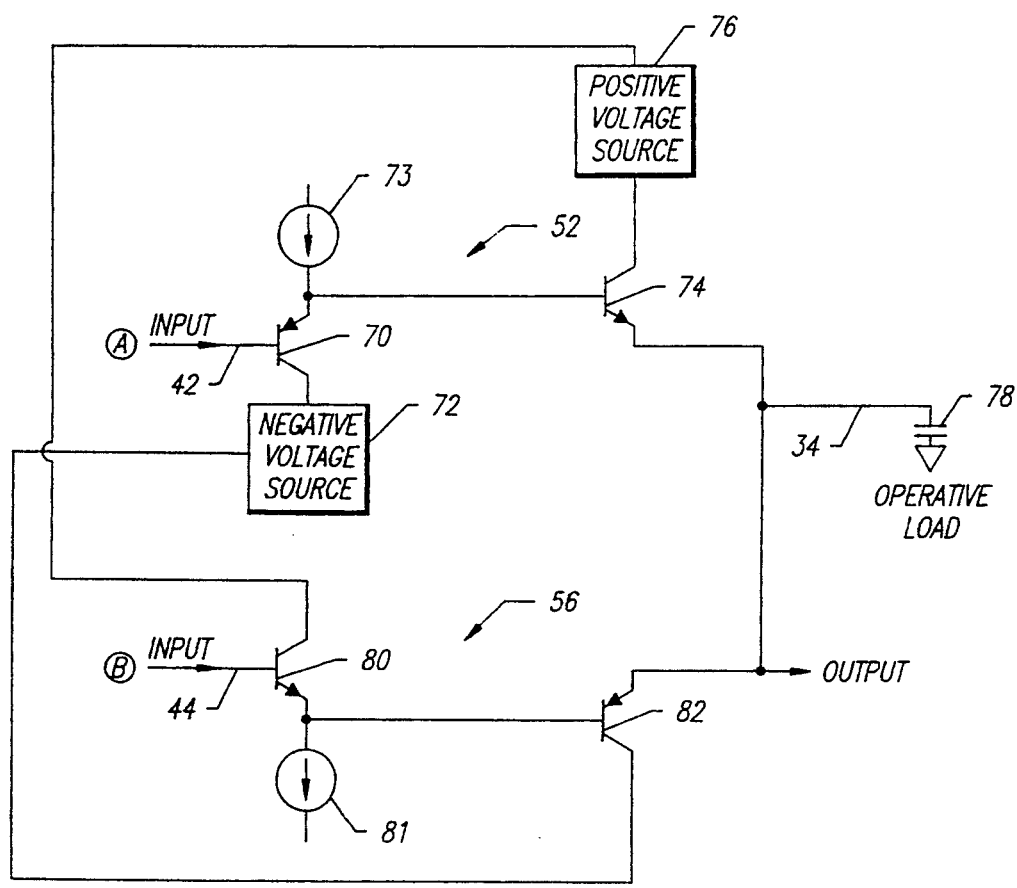
FIG. 4 is a circuit diagram of the blocks designated as "Positive Output Drive" and "Negative Output Drive" in the circuitry shown in FIG. 2.

FIG. 4 illustrates the circuit diagrams of the drive circuits 52 and 56 in some detail. The positive output circuitry 52 includes a transistor 70 which may be a pnp transistor. The base of the transistor 70 is connected to the line A (42) and the collector of the transistor 70 is connected to receive a voltage from a negative voltage source 72. The emitter of the transistor 70 has a common connection with a current bias generator 73 and with the base of a transistor 74 which may be an npn transistor. The current bias generator 73 is constructed in a well known manner to provide a substantially constant current. The collector of the transistor 74 receives a voltage from a positive voltage source 76. The emitter of the transistor 76 has a common connection with the output line 34 (also shown in FIGS 1 and 5) and with one terminal of a load capacitance 78. The other terminal of the capacitance 78 receives a reference potential such as ground.

The voltage on the line B (44) is introduced to the base of a transistor 80 which may be an npn transistor. The collector of the transistor 80 receives a positive voltage from the source 76. A connection is made from the emitter of the transistor 80 to a current bias generator 81 and to the base of a transistor 82 which may be a pnp transistor. The current bias generator 81 is constructed in a well known manner to provide a substantially constant current. A voltage is applied to the collector of the transistor 82 from the negative voltage source 72. The emitter of the transistor 82 is common with the line 34 and the ungrounded terminal of the capacitance 78.

Without the voltage difference provided on the line A (42) and the line B (44) by the resistance 48, the inputs on the lines 42 and 44 would be at the same voltage. Thus, to reduce the currents in the output stages of the positive output drive circuit 52 and the negative output drive circuit 56 to the same range of currents as provided by the input stage current bias generators 73 and 81, the input stages of the drive circuits 52 and 56 would have to be made approximately as large as the output stages of the drive circuits. This would considerably increase the distributed capacitances 54 and 58 of the input stages of the drive circuits 52 and 56 beyond values which are practical in high frequency applications.

Assume that a clamping voltage of approximately 2.8 volts is applied from the line A (42) to the base of the transistor 70 and that a control voltage of 2.92 volts is applied from the line B (44) to the base of the transistor 80. The constant current through the bias generator 73 causes a voltage (e.g. 3.4 volts) to be produced on the emitter of the transistor 70 because of the voltage drop between the emitter and the base of the transistor. The voltage on the emitter of the transistor 70 is introduced to the base of the transistor 74 to produce a flow of current through the transistor 74. This current charges the capacitance 78 to a suitable value such as approximately 2.8 volts. The voltage of approximately 2.8 volts is produced across the capacitor 78 because of the voltage drop between the base and the emitter of the transistor 74. The voltage across the capacitance 78 constitutes the voltage on the output line 34.

The control voltage (2.92 V.) on the base of the transistor 80 causes the constant current from the bias generator 81 to flow through the transistor. Because of the voltage drop through the transistor 80, the voltage on the emitter of the transistor is approximately 2.3 volts. Since the voltage on the emitter of the transistor 82 is approximately 2.8 volts, the transistor 82 is minimally conductive.

The constant currents through the bias generators 73 and 81 are limited to relatively low values. Under static conditions the currents in the transistors 74 and 82 are equal. Their currents are set by the difference between their base voltages. For example, the current in the transistor 74 is dependent upon the voltage between the base and the emitter of the transistor and this voltage is approximately equal to half of the difference between the voltages on the bases of the transistors 74 and 82. Because of the low current in the drive stages 52 and 56, relatively little energy is consumed in the drive stages when the comparison voltage on the line 28 is greater than the comparison voltage on the line 30. The relatively low current through the transistors in the drive stages 52 and 56 allows the transistors to be of relatively small size. Furthermore, the low consumption of energy in the drive circuits 52 and 56 allows the drive circuits to respond relatively quickly to the comparison voltages on the lines 28 and 30.

When the voltage on the line 30 is greater than the voltage on the line 28, the clamping voltage of approximately 0.4 volts is produced on the line B (44) and the control voltage of approximately 0.28 volts is produced on the line 42 (A). The clamping voltage of approximately 0.4 volts is applied to the base of the transistor 80 and the control voltage of approximately 0.28 volts is applied to the base of the transistor 70. Because of the flow of the constant current through the bias generator 81 and the transistor 80, a voltage less than 0.4 volts is produced on the emitter of the transistor 80. This voltage is introduced to the transistor 82, which is in an emitter follower stage, to make the transistor 82 conductive. A voltage such as 0.4 volts is accordingly produced on the emitter of the transmitter 82. The voltage across the capacitance 78 accordingly has a value of approximately 0.4 volts. The input capacitance 58 also becomes charged.

The constant current through the bias generator 73 flows through the transistor 70 to produce a voltage greater than approximately 0.28 volts on the emitter of the transistor. Since the voltages between the bases and emitters of the transistors 74 and 82 are less than the voltages between the bases and emitters of the transistors 70 and 80, the currents through the transistors 74 and 82 will be low.

In view of the above, the drive stage 52 has the same advantages when the voltage on the line 30 is greater than the voltage on the line 28 as the drive stage 56 has when the voltage on the line 28 is greater than the voltage on the line 30. For example, the currents through the transistors 70 and 80 are relatively low because these currents are respectively limited by the bias generators 73 and 81. In view of the above, relatively little energy is consumed in the drive stage 52. The low currents through the transistors are also advantageous because they allow the transistors to have a relatively small size and to respond relatively quickly.

Furthermore, since there is a constant difference in FIG. 6 between the voltages on the lines 42 and 44 whether the control voltage is 2.92 volts or 0.28 volts at any instant, the delay between the production of voltages on the output line 34 in response to input signals on the lines 28 and 30 is symmetrical. In other words, the time between the introduction of a signal on the line 28 to the current steering circuit 36 in FIG. 2 and the production of an output voltage of a high value on the line 34 is substantially the same as the time between the introduction of a signal on the line 30 to the current steering circuit and the production of an output voltage of a low value on the line 34. Furthermore, the time between the production of the input and output voltages is relatively short because of the instantaneous operation of the transistors 70 and 80 in providing voltages controlling the conductivity of the transistors 74 and 82 and because of the high conductance in the transistors 70 and 80 and the low energy consumed in the transistors 70, 74, 80 and 82.

Figure 3:
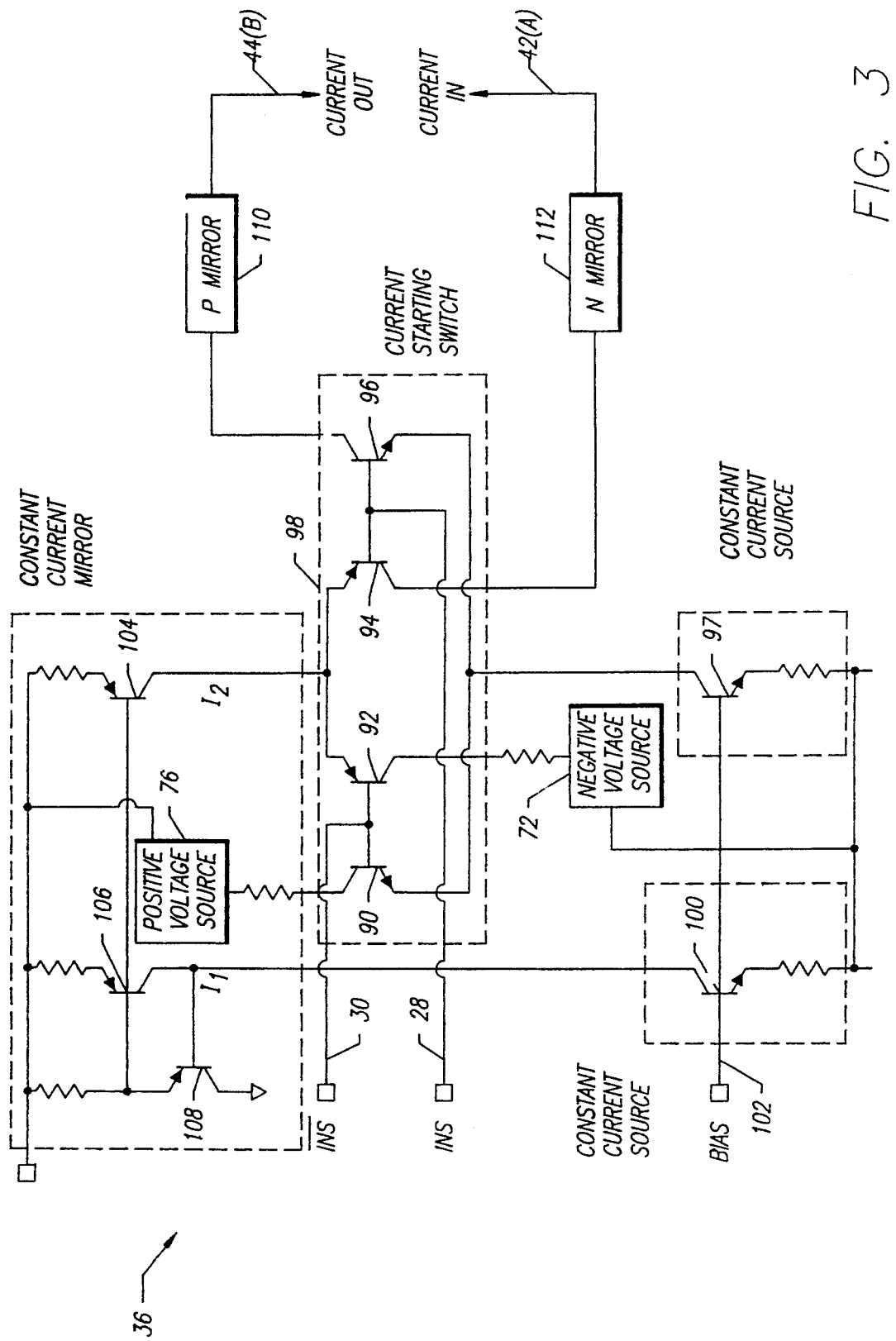
FIG. 3 is a simplified diagram showing in additional detail a current steering circuit included in the circuitry shown in FIG. 2.

FIG. 3 illustrates the current steering circuit 36 of FIG. 2 in additional detail. In the embodiment shown in FIG. 3, the signals on the lines 30 and 28 are shown as respectively being introduced to the bases of transistors 90 and 92 and the bases of transistors 94 and 96. The transistors 90 and 96 may be npn transistors and the transistors 92 and 94 may be pnp transistors. The transistors 90, 92, 94 and 96 may be included in a current steering switch indicated in broken lines at 98 in FIG. 3.

The collector of the transistor 90 receives a positive energizing voltage from the source 76 and the collector of the transistor 92 receives a negative energizing voltage from the source 72. The emitters of the transistors 90 and 96 are common with the collector of a transistor 97, which may be an npn transistor. The bases of the transistor 97 and a transistor 100 (which may also be an npn transistor) receive a substantially constant bias voltage on a line 102. The emitters of the transistors 97 and 100 are energized by a negative voltage from the source 72. Each of the transistors 97 and 100 may be considered to be a source of constant current as indicated by broken lines with the designation "constant current source."

The emitters of the transistors 92 and 94 are common with the collector of a transistor 104, which may be a pnp transistor. The emitters of the transistor 104 and of transistors 106 and 108 are energized by a positive voltage from the source 76. The transistors 106 and 108 may be pnp transistors. The bases of the transistors 104 and 106 and the emitter of the transistor 108 are common. The collector of the transistor 106 and the base of the transistor 108 are common with the collector of the transistor 100. The collector of the transistor 108 receives a reference potential such as ground. The transistors 104, 106 and 108 are shown as being enclosed in a box with broken lines, the box being designated as "constant current mirror."

The current from the collector of the transistor 96 is introduced through a p current mirror 110 to the line 44 (B) also shown in FIGS. 2 and 4. The mirror 110 may include pnp transistors and may be constructed in a conventional manner. The current on the collector of the transistor 94 is similarly introduced through an n current mirror 112 to the line 42 (A) also shown in FIGS. 2 and 4. The mirror 112 may include npn transistors and may be constructed in a conventional manner.

The transistors 97 and 100 may be considered to constitute constant current sources providing substantially equal currents. The transistors 104, 106 and 108 may be considered to constitute a mirror of the constant current sources. The mirror is provided by the constant current through the transistor 108 and by the introduction of the resultant constant voltage on the emitter of the transistor 108 to the bases of the transistors 104 and 106. As a result, a constant current of one polarity and of a particular magnitude is introduced to the emitters of the transistors 90 and 96 and a constant current of the opposite polarity and the particular magnitude is introduced to the emitters of the transistors 92 and 94. The construction of constant current sources and the mirrors for constant current sources is well known in the art.

The symmetrical relationship of the current steering switch defined by the transistors 90, 92, 94 and 96 is unbalanced by signals on the lines 28 and 30. A positive signal on the line 28 produces an increased flow of current through a circuit including the line 44 (B), the mirror 110 and the transistor 96. A positive signal on the line 30 produces an increased flow of current through the line 42 (A) from a circuit which includes the mirror 112 and the transistor 94.

The system constituting this invention has been specifically disclosed for TTL applications. However, the system can be adapted for other applications including ECL and CMOS circuitry without departing from the scope of the invention. For CMOS applications, the clamp voltages should be set to voltages near the positive and negative supplies. For ECL applications, the clamp voltages should be set to a smaller range near the negative supply in accordance with ECL standards.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination, for use in a comparator for determining the time at which the magnitude of a variable analog input voltage crosses the magnitude of an analog reference voltage in two opposite directions,
   means for providing the analog input voltage,
   means for providing the analog reference voltage,
   means for providing first and second clamping voltages related to the analog reference voltage,
   coupling means respectively responsive to the first and second clamping voltages and to the difference between the analog input voltage and the analog reference voltage for providing first and second control voltages respectively different by a particular magnitude from the first and second clamping voltages, and
   driver means responsive to the first and second control voltages and the first and second clamping voltages for providing first and second output voltages respectively representative of the times when the magnitude of the input voltage crosses the magnitude of the reference voltage in the two opposite directions.

2. In a combination as set forth in claim 1,
   the coupling means including an impedance connected to provide the first control voltage at the particular magnitude above the first clamping voltage and to provide the second control voltage at the particular magnitude below the second clamping voltage.

3. In a combination as set forth in claim 1,
   the driver means being constructed to provide equal delays in the crossing in opposite directions of the magnitude of the input voltage relative to the magnitude of the reference voltage.

4. In a combination as set forth in claim 1,
   the driver means including a capacitance chargeable to provide the first and second output voltages in accordance with the crossing in the magnitude of the input voltage relative to the magnitude of the reference voltage in the two opposite directions.

5. In combination, for use in a comparator for determining the time at which the magnitude of a variable analog input voltage crosses the magnitude of an analog reference voltage in first and second opposite directions,
   first means for providing the variable analog input voltage,
   second means for providing the analog reference voltage,
   third means for providing first and second clamping voltages having magnitudes straddling the magnitude of the reference voltage, and
   fourth means responsive to the first and second clamping voltages and the analog input and reference voltages for providing first and second output voltages in which the delay in the first output voltage relative to the crossing in the first direction of the magnitude of the input voltage relative to the magnitude of the reference voltage is the same as the delay in the second output voltage relative to the crossing in the second direction of the magnitude of the input voltage relative to the magnitude of the reference voltage.

6. In a combination as set forth in claim 5,
   the fourth means including first and second drive circuits and a capacitance connected to the drive circuits to become charged to a voltage level related to the first clamping voltage with the magnitude of the input voltage crossing the magnitude of the reference voltage in the first direction and related to the second clamping voltage with the magnitude of the input voltage crossing the magnitude of the reference voltage in the second direction.

7. In a combination as set forth in claim 6 wherein
   the third means includes means for providing first and second control voltages respectively separated from the first and second clamping voltages by a particular magnitude and the driver means includes means responsive to the first and second clamping voltages and the first and second control voltages for providing the first and second output voltages 8. In a combination as recited in claim 5,
   the third means including an impedance connected in the third means to provide the first and second control voltages respectively separated from the first and second clamping voltages by the particular magnitude.

9. In combination, for use in a comparator for determining the time at which the magnitude of a variable analog input voltage crosses the magnitude of an analog reference voltage in first and second opposite directions, means for providing the variable analog input voltage, means for providing the analog reference voltage, clamping means for providing first and second clamping voltages, coupling means for providing first and second control voltages, the coupling means being responsive to the crossing of the magnitude of the input voltage relative to the magnitude of the reference voltage in the first direction for producing a first control voltage above the first clamping voltage by a particular magnitude and being responsive to the crossing of the magnitude of the input voltage relative to the magnitude of the reference voltage in the second direction for producing a second control voltage below the magnitude of the second clamping voltage by the particular magnitude, and drive means responsive to the first and second clamping voltages and the first and second control voltages for producing first and second output voltages in which the delay is the same between the crossing of the magnitude of the input voltage relative to the reference voltage in the first direction and between the crossing of the magnitude of the input voltage relative to the reference voltage in the second direction.

10. In a combination as set forth in claim 9, the clamping means including first and second clamping means, and the coupling means including an impedance coupling the first and second clamping means to produce the first and second control voltages in accordance with the crossing of the magnitude of the input voltage relative to the reference voltage in the first and second opposite directions.

11. In a combination as set forth in claim 9, the drive means including first and second input capacitances and also including means responsive to the first control voltage and the first clamping voltage and operatively coupled to the first input capacitance for charging the first input capacitance in accordance with the magnitude of the first clamping voltage and for discharging the second input capacitance in accordance with the magnitude of the second control voltage and further including means responsive to the second control voltage and the second clamping voltage and operatively coupled to the second input capacitance for charging the second input capacitance in accordance with the magnitude of the second clamping voltage and for discharging the second input capacitance in accordance with the magnitude of the first control voltage.

12. In a combination as set forth in claim 11, the drive means including first and second input capacitances and means for charging the first input capacitance in accordance with the magnitude of the first clamping control voltage and for charging the second input capacitance in accordance with the magnitude of the second clamping voltage and including means for discharging the second capacitance during the charging of the first input capacitance and for discharging the first input capacitance during the charging of the second input capacitance.

13. In combination, for use in a comparator for determining the time at which the magnitude of a variable input voltage crosses the magnitude of a reference voltage in first and second opposite directions, comparator means for comparing the input voltage and the reference voltage and for providing a first comparison voltage upon the occurrence of first results in the comparison and for providing a second comparison voltage upon the occurrence in the comparison of second results different from the first results, means for providing first and second clamping voltages, coupling means respectively responsive to the first and second comparison voltages and to the first and second clamping voltages for producing first and second control voltages, and drive means responsive to the first and second clamping voltages and the first and second control voltages for producing a first output voltage in accordance with the production of the first clamping voltage and the first control voltage and a second output voltage in accordance with the production of the second clamping voltage and the second control voltage, the first output voltage having substantially the same delay relative to the occurrence of the first results in the comparison between the input and reference voltages as the delay between the second output voltage relative to the second results in such comparison.

14. In a combination as set forth in claim 13, the coupling means being responsive to the first and second clamping voltages for providing the first and second control voltages with particular magnitudes relative to the first and second clamping voltages, and the drive means being responsive to the first and second clamping voltages and the first and second control voltages for producing the first output voltage in accordance with the production of the first clamping voltage and the first results in the comparison of the input and reference voltages and for producing the second output voltage in accordance with the production of the second clamping voltage and the second results in the comparison of the input and reference voltages.

15. In a combination as set forth in claim 13, means included in the drive means for preventing the first control voltage from having any effect on the production of the second output voltage and for preventing the second control voltage from having any effect on the production of the first output voltage.

16. In a combination as set forth in claim 13, the coupling means including an impedance for producing the first control voltage upon the production of the first clamping voltage and the occurrence of the first results in the comparison between the input and reference voltages and for producing the second control voltage upon the production of the second clamping voltage and the occurrence of the second results in such comparison.

17. In a combination as set forth in claim 13, the drive means including energy storage means, the drive means being operative to charge the energy storage means to a first particular value related to the first clamping voltage upon the introduction of the first clamping voltage and the first control voltage to the drive means, the drive means being operative to charge the energy storage means to a second particular value related to the second clamping voltage upon the introduction of the second clamping voltage and the second control voltage to the clamping means.

18. In a combination as set forth in claim 17,
the coupling means being responsive to the first results in the comparison between the input and reference voltages for providing for the introduction of the first clamping voltage and the first control voltage to the drive means and being responsive to the second results of such comparison for providing for the introduction of the second clamping voltage and the second control voltage to the drive means.

19. In combination, for use in a comparator for determining the time at which the magnitude of a variable input voltage crosses the magnitude of a reference voltage in first and second opposite directions,
comparator means responsive to the input voltage and the reference voltage for providing a first comparison voltage representing a first relationship between the magnitudes of the input voltage and the reference voltage and for providing a second comparison voltage representing a second relationship, opposite to the first relationship, between the magnitudes of the input voltage and the reference voltage,
means for providing first and second clamping voltages,
means responsive to the first and second clamping voltages and the first and second comparison voltages for producing first and second control voltages respectively differing from the first and second clamping voltages by a particular magnitude, and
drive means responsive to the first and second clamping voltages and the first and second control voltages for producing first and second output voltages respectively related to the first and second clamping voltages, each of the first and second output voltages being delayed by a particular time relative to the occurrence of the first and second comparison voltages.

20. In a combination as set forth in claim 19,
means for providing the first control voltage upon the production of the first comparison voltage and for providing the second control voltage upon the production of the second comparison voltage, the drive means being responsive to the first clamping voltage and the first control voltage to provide the first output voltage and being responsive to the second clamping voltage and the second control voltage to provide the second output voltage.

21. In a combination as set forth in claim 20,
first and second lines in the coupling means,
the coupling means providing the first control voltage on the first line during the production of the first clamping voltage on the second line and providing the second control voltage on the second line during the production of the second clamping voltage on the first line.

22. In a combination as set forth in claim 21 wherein
an impedance is connected between the first and second lines to obtain the production of the first control voltage on the first line during the production of the first clamping voltage on the second line and to obtain the production of the second control voltage on the second line during the production of the second clamping voltage on the first line.

23. In a combination as set forth in claim 22,
the coupling means being operative to provide a voltage difference of a particular magnitude between the first clamping and control voltages and to provide a voltage difference of the particular magnitude between the second clamping and control voltages.

24. In a combination as set forth in claim 21,
the coupling means including means connected between the first and second lines for obtaining the production of the first control voltage on the first line when the first clamping voltage is produced on the second line, the first control voltage being greater than the first clamping voltage by a particular magnitude, and for obtaining the production of the second control voltage on the second line when the second clamping voltage is produced on the first line, the second control voltage being less than the second clamping voltage by the particular magnitude.

25. In combination, for use in a comparator for determining the time at which the magnitude of a variable analog input voltage crosses the magnitude of a variable reference voltage in first and second opposite directions,
first means for providing the variable analog input voltage,
second means for providing the reference voltage,
third means responsive to the input voltage and the reference voltage for providing first and second comparison voltages representing first and second opposite results in the comparison,
fourth means for respectively providing first and second clamping voltages on first and second lines, and
fifth means responsive to the first clamping voltage on the first line and the production of the first comparison voltage for producing a first control voltage on the second line and responsive to the second clamping voltage on the second line and the production of the second comparison voltage for producing a second control voltage on the first line, the first control voltage differing from the first clamping voltage by a particular magnitude and the second control voltage differing from the second clamping voltage by the particular magnitude.

26. In a combination as set forth in claim 25,
there being an impedance connected between the first and second lines to provide the voltage difference of the particular magnitude between the first clamping voltage and the first control voltage and between the second clamping voltage and the second control voltage.

27. In a combination as set forth in claim 25 wherein
the fifth means includes current steering circuitry responsive to the first comparison voltage for providing for a flow of current in a first direction through the impedance to obtain the production of the first control voltage on the second line and responsive to the second comparison voltage for providing for a flow of current in a second direction through the impedance to obtain the production of the second control voltage on the first line, the second direction being opposite to the first direction.

28. In a combination as set forth in claim 26 wherein the flow of current through the impedance in the first direction is operative to provide the first control voltage with a magnitude greater than the first clamping voltage by the particular magnitude and the flow of current through the impedance in the second direction is operative to provide the second control voltage with a magnitude less than the second clamping voltage by the particular magnitude.

29. In a combination as set forth in claim 28 wherein sixth means are provided for regulating the magnitude of the first clamping voltage and seventh means are provided for regulating the magnitude of the second clamping voltage.

30. In a combination as set forth in claim 29 wherein eighth means are responsive to the first and second clamping voltages and the first and second control voltages for producing first and second output voltages respectively indicative of the time when the magnitude of the input voltage crosses the magnitude of the reference voltage in the first and second opposite directions.

31. In combination, for use in a comparator for determining the time at which the magnitude of a variable analog input voltage crosses the magnitude of an analog reference voltage in first and second opposite directions, means for providing first and second clamping voltages, means for providing the variable analog input voltage, means for providing the analog reference voltage, means responsive to the input voltage, the reference voltage and the first and second clamping voltages for providing first and second control voltages having magnitudes related to the first and second clamping voltages, first drive means responsive to the first clamping voltage and the second control voltage, and second drive means responsive to the second clamping voltage and the first control voltage and having a common output with the first drive means, the first and second drive means being operative to produce at the common output the first clamping voltage when the magnitude of the variable input voltage crosses the magnitude of the reference voltage in the first direction and to produce at the common output the second clamping voltage when the magnitude of the variable input voltage crosses the magnitude of the reference voltage in the second direction.

32. In a combination as set forth in claim 31 wherein the magnitude of the first control voltage is greater than the magnitude of the first clamping voltage by a particular magnitude and wherein the magnitude of the second control voltage is less than the magnitude of the first clamping voltage by the particular magnitude and wherein the first drive means is responsive to the second control voltage to limit energy consumption in the first drive means when the second drive means produces the second clamping voltage and wherein the second drive means is responsive to the first control voltage for limiting energy consumption in the second drive means when the first drive means is operative to produce the first control voltage.

33. In a combination as set forth in claim 32 wherein the first drive means includes a first constant current source and a first emitter follower and the second drive means includes a second constant current source and a second emitter follower.

34. In a combination as set forth in claim 31 wherein the first drive means is operative to produce at the common output the first clamping voltage and the second drive means includes a stage biased to a state of non-conductivity by the first clamping voltage to prevent the common output from being affected by the first control voltage and wherein the second drive means is operative to produce at the common output the second clamping voltage and the first drive means includes a stage biased to a state of non-conductivity by the second clamping voltage to prevent the common output from being affected by the second control voltage.

35. In a combination as set forth in claim 34 wherein the first drive means includes a first constant current source and a first emitter follower and the second drive means includes a second constant current source and a second emitter follower and wherein the means providing the first and second control voltages provides the first control voltage with a magnitude greater by a particular amount than the first clamping voltage and provides the second control voltage with a magnitude less by a particular amount than the second control voltage.

36. In a combination as set forth in claim 35 wherein the means providing the first and second control voltages includes first and second lines and includes means for providing the first control voltage on the first line and the first clamping voltage on the second line and for providing the second control voltage on the second line and the second clamping voltage on the first line.

37. In a combination as set forth in claim 36 wherein an impedance is connected between the first and second lines.

38. In a combination as set forth in claim 35 wherein the means providing the first and second control voltages includes an impedance connected between the first and second lines for receiving a current in a first direction for the production of the first control voltage and for receiving a current in a second direction for the production of the second control voltage, the second direction being opposite to the first direction.

* * * * *